(12) United States Patent  
Salessi (10) Patent No.: US 8,159,152 B1  
(45) Date of Patent: Apr. 17, 2012

(54) HIGH-POWER LED LAMP

(76) Inventor: Nader Salessi, Laguna Niguel, CA (US)

( * ) Notice: Subject to any disclaimer, the term of this patent is extended or adjusted under 35 U.S.C. 154(b) by 378 days.

(21) Appl. No.: 12/454,532

(22) Filed: May 19, 2009

Related U.S. Application Data (60) Provisional application No. 61/128,272, filed on May 20, 2008.

(51) Int. Cl.  
*H05B 37/02* (2006.01)

(52) U.S. Cl. ........ 315/309; 315/113; 315/291; 362/327; 362/362; 362/373; 362/547; 257/E33.059; 257/E25.02; 257/E23.082; 257/290

(58) Field of Classification Search .................. 315/113, 315/291, 309; 362/327, 362, 373, 547; 257/E33.059, E25.02, E23.082, 290  
See application file for complete search history.

(56) References Cited

U.S. PATENT DOCUMENTS

| | | | |
|---|---|---|---|
| 6,964,501 B2 | 11/2005 | Ryan | |
| 7,208,881 B2 | 4/2007 | Young | |
| 7,344,279 B2 * | 3/2008 | Mueller et al. | 362/294 |
| 2005/0243539 A1 | 11/2005 | Evans et al. | |
| 2005/0276053 A1 * | 12/2005 | Nortrup et al. | 362/294 |
| 2005/0279949 A1 * | 12/2005 | Oldham et al. | 250/458.1 |
| 2006/0107986 A1 | 5/2006 | Abromov et al. | |
| 2006/0151801 A1 * | 7/2006 | Doan et al. | 257/99 |
| 2006/0198149 A1 | 9/2006 | Jonsson et al. | |
| 2007/0013057 A1 * | 1/2007 | Mazzochette | 257/723 |
| 2007/0018175 A1 | 1/2007 | Mazzochette et al. | |
| 2007/0102033 A1 | 5/2007 | Petrocy | |

FOREIGN PATENT DOCUMENTS

WO WO 2006056066 A1 * 6/2006

* cited by examiner

*Primary Examiner* — Douglas W Owens  
*Assistant Examiner* — Thai Pham  
(74) *Attorney, Agent, or Firm* — Kuta IP Law, LLC; Christine M. Kuta (57) ABSTRACT

A high-power light-emitting diode (LED) lamp has a plurality of units. Each unit includes an LED die and a thermo-electric cooling device coupled to the LED die. A power source supplies a fixed current to the thermo-electric cooling device wherein the fixed current is based on heat generated by the LED die in normal operation. Accordingly, the unit operates without a controller.

21 Claims, 11 Drawing Sheets

HIGH-POWER LED LAMP

CROSS-REFERENCES

This application claims priority of U.S. provisional application Ser. No. 61/128,272 filed May 20, 2008 and titled "High-Power LED Lamp" by the present inventor the contents of which are hereby incorporated by reference in their entirety.

BACKGROUND

Gas discharge lamps and incandescent lamps are well known in the art. Gas sources and incandescent lamps have relatively high energy consumption. Further, gas sources and incandescent lamps have relatively short lifetimes and are susceptible to breakage, typically leading to high maintenance costs. Further, the light intensity of gas discharge lamps tends to decrease over time with use. Additionally, gas discharge lamps typically produce ozone due to high voltage requirements and produce intense ultra-violet light that tends to cause the breakdown of many materials and may lead to gas leakage into the environment.

Solid state lighting, such as light emitting diode (LED) lighting has been developed to overcome some of the problems of gas discharge lamps and incandescent lamps. Many conventional LED devices, however, are limited by thermal energy-management issues.

It is known that LEDs exhibit negative temperature coefficient aspects, i.e. at fixed power input, as the device's operating heat rises, the device's light output decreases and it shortens the life of LED. Additionally, it is desirable to run LEDs using high current, because the higher the current, the higher the brightness of the emitted light. Further, high heat during use can shorten the useful life of an LED. Accordingly, there is motivation to remove heat as much as possible in order to operate an LED optimally with regard to power input and light output and LED life.

In addition, where a plurality of LED's are required for higher brightness, there are limits to how close they can be positioned next to one another due to the problem of heat dissipation. Accordingly, it is desirable to cool an LED device in order to maximize energy efficiency and lifespan as well as to broaden design options.

Conventional solutions to undesirable thermal buildup include fans, cooling fins, spacing assemblies, etc. to reduce lamp housing temperature. Another conventional solution involves mounting LED modules on large conductive heat sinks. A light emitting diode (LED) must be mounted on a relatively large metal heat sink to dissipate the heat when the diode is run using high current. In high use and in demanding situations, the thermal transfer from the LEDs through the thermally connected heat spreading plate to the housing is insufficient to maintain a desirable LED temperature. Unfortunately, thermal back-flow may occur as a housing is heated by the ambient atmosphere beyond an optimal point which allows thermal conduction back to the heat spreading plate. In such situations, rapid LED degradation often occurs and unit efficiency drops.

The above techniques for thermal removal have the common disadvantage of using direct passive conduction and convection heat transfer from the LED(s) to the heat sink or heat spreading plate and thereafter to the housing. The passive nature of these techniques limits the cooled temperature of the LED(s) to at or near an ambient atmospheric temperature. Since the units are often in close conjunction or are retained in decorative housings, passive heat transfer and thermal back-flow rapidly reduce cooling efficiency.

Solid state thermoelectric modules (TEM) also referred to as thermoelectric coolers (TEC) or heat pumps have been used in various applications. A TEM, in a thermocooling application, converts electrical energy into a temperature gradient, known as the "Peltier" effect. By applying a current through a TEM, a temperature gradient is created and heat is transferred from one side, the "cold" side of the TEM to the other side, the "hot" side.

The Peltier effect is well known by those skilled in the related arts and provides an active solid-state thermoelectric cooling function from a cool side to a hot side. The cool side is commonly placed against a surface or substrate which requires cooling. For example, the back surface of an LED assembly. The hot side is commonly placed against a surface or substrate which absorbs the transferred thermal energy and transfers it through conduction to a heat spreading plate. Through the utilization of these thermo-electric effects, thermal transfer from a cool side to a hot side can be controlled by controlling a current supplied to the thermo-electric effect.

Unfortunately, conventional constructions substantially negate the optimal use of an active cooling device by directly or indirectly connecting an LED or light array to a housing or heat spreading plate in a manner which allows thermal back flow to the lighting array through either thermal conduction or convection mechanisms.

There is a long-felt need for LED devices of long service life and high electric power-to-light efficiency.

SUMMARY

The present invention is directed to an apparatus to provide solid-state illumination efficiently, reliably and with flexible design. In order to maintain efficient light output from a lamp including LEDs, especially a lamp including high brightness LED arrays, it is beneficial for the lamp to be provided with an effective heat removal system. An effective heat removal system also typically increases the lamp's lifetime under operating conditions. Accordingly, embodiments of the present invention include an improved light emitting apparatus having a highly efficient cooling system.

Embodiments of the present invention include a solid-state high-powered lighting assembly using a solid-state thermoelectric cooling system. A high-power LED lamp is constructed using a plurality of replaceable modules. Each module includes a plurality of light engine units. In a first embodiment, each light engine unit has an LED die coupled to thermoelectric cooling device. The thermoelectric cooling device is supplied with a predetermined constant current. The predetermined constant current is based on measured cooling needs of the LED die and determined to substantially maximize energy efficiency and substantially maximize LED life. The modules are configured to operate in an array of such modules. In one embodiment of the invention, the array is configured to provide illumination for a specific application such as a street lamp, parking lot illumination, parking structure illumination and area lighting In one embodiment, a unit for a high-power LED lamp includes an LED die and a thermo-electric cooling device coupled to the LED die. A power source supplies a fixed current to the thermo-electric cooling device wherein the fixed current is based on heat generated by the LED die in normal operation. Accordingly, the unit operates without a controller. The thermo-electric cooling device supplies cooling to the location where heat is generated and without a controller thereby minimizing space. Further, power usage is also minimized. This embodiment further realizes a savings of the cost of a controller.

In an alternative arrangement, the thermo-electric cooling device is positioned at a hot-spot of the LED die thereby supplying heat transfer to the location where it is needed minimizing waste.

In another embodiment of the invention, a plurality of units are supported by a common substrate to form module for a high-power LED lamp. The module, in a first embodiment includes a conductive substrate. The conductive substrate supports a plurality of LED units mounted on the conductive substrate wherein each LED unit of the plurality includes an LED die and a thermo-electric cooling device thermally coupled to the LED die. The module further includes a means for supplying each thermo-electric cooling unit with a fixed current.

In another embodiment of the invention, a high power LED lamp includes a plurality of LED modules configured to operate together to provide light, each module configured to be removable and replaceable. Each module includes a conductive substrate and a plurality of LED units mounted on the conductive substrate wherein each LED unit of the plurality includes an LED die and a thereto-electric cooling device thermally coupled to the LED die. The module further includes a means for supplying each thermo-electric cooling unit with a fixed current.

The present invention together with the above and other advantages may best be understood from the following detailed description of the embodiments of the invention illustrated in the drawings, wherein:

DESCRIPTION

A high-power LED lamp is constructed using a plurality of replaceable modules. Each module includes a plurality of light engine units. In a first embodiment, each light engine unit has an LED die coupled to a cooling device. The cooling device is supplied with a predetermined constant current. The predetermined constant current is based on measured cooling needs of the LED die and determined to substantially maximize energy efficiency and substantially maximize LED life. The modules are configured to operate in an array of such modules. In one embodiment of the invention, the array is configured to provide illumination for a specific application such as a street lamp, parking lot illumination, parking structure illumination and area lighting.

Figure 1:
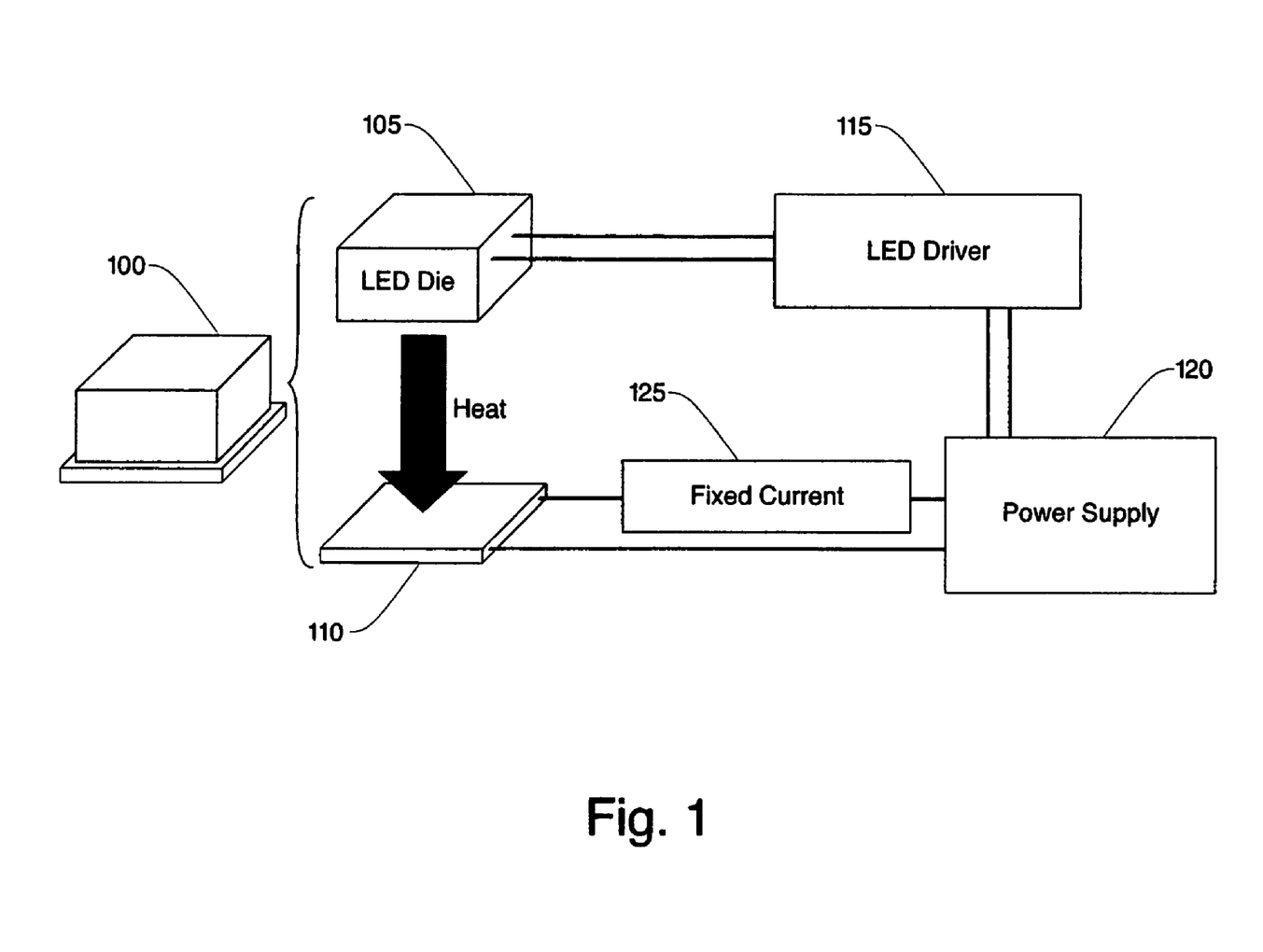
FIG. 1 is a diagram illustrating a unit of a high-power LED lamp according to principles of the invention.

FIG. 1 shows a light engine unit according to one embodiment of the invention. The light engine unit ("the unit") 100 includes an LED die 105 thermally engaged with a cooling device 110. The LED die 105 is electrically coupled to an LED driver 115. A power supply 120 powers the LED driver 115 and supplies a fixed current 125 to the cooling device 110.

The LED die 105 is, for example, a chip of semiconducting material impregnated with impurities to create the p-n junction and configured to emit light when electrically biased. The LED die 105 has a thickness, for example, of 100-150 micrometers. The cooling device 110 is, for example, a thermo-electric device and is thermally engaged with the LED die such that heat is directed away from the LED die. An example thermo-electric device has a thickness of 10 micrometers. The thermo-electric device, also referred to as Peltier device, removes heat from the LED die through the Peltier effect. The thermo-electric device creates a temperature difference in response to an applied voltage. In one embodiment, the thermo-electric device is a thin film micro cooling device. In another embodiment, the thermo-electric device is a nanotechnology device. The cooling device is for example a nanocooler available from nanoCoolers of Austin, Tex. Alternatively, the cooling device is a thin film thermo-electric device available from Micropelt GmbH of Freiburg, Germany. In one embodiment, the cooling device is coupled to the LED die using conventional semiconductor attachment method such as soldering. In an alternative embodiment, the LED and the cooling device are manufactured together using micro processes or further alternatively using nanotechnology processes. In a preferred embodiment, the micro or nano manufacturing produces a layered LED/cooling device structure. The present invention, however, is not limited by the method of thermally coupling the LED die 105 to the cooling device 110.

The LED driver 115 is a typical LED driver. The power supply 120 is configured to supply a predetermined fixed current 125 to the cooling device 110. In a first embodiment of the invention, the fixed current 125 is based on typical junction temperature of the LED. In another embodiment, the fixed current 125 is based on typical usage and design of the lamp in which the LED unit 100 operates. Example applications are a street lamp, parking lot lamp and a parking structure lamp. Typical usage factors include weather factors and other environmental factors as well as lamp design. Another factor that may be used in determining the fixed current is average ambient temperature around the lamp in operation.

In operation, the LED die 105 emits light in response to the LED driver 115 which are both powered by the power supply 120. The cooling device 110 is supplied with a fixed current 125 by the power supply 120 and operates to cool the LED die 105. Operating the cooling device 110 at the fixed current 125 enables the unit 100 to operate without a controller thereby realizing both a cost savings and a form factor benefit in saving space that would be otherwise occupied by housing a controller.

Figure 2:
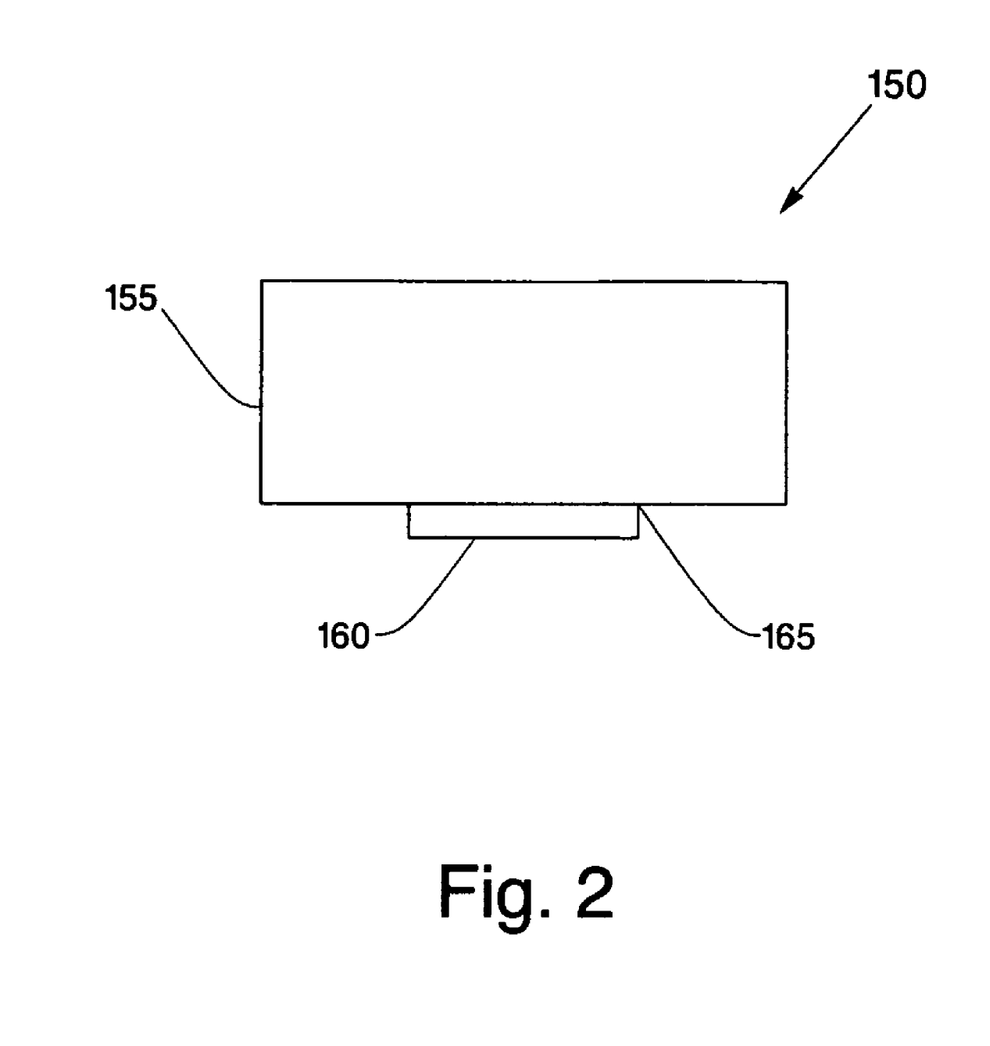
FIG. 2 is a side view of a unit of a high-power LED lamp showing advantageous positioning of a thermo electric cooling device according to principles of the invention.

FIG. 2 shows an alternative embodiment of a high-power LED unit wherein the thermo-electric device is advantageously positioned. The unit 150 includes an LED die 155 and a cooling device 160. The LED die 155 and cooling device 160 are thermally coupled together. An LED die in some configurations has a hot spot 165. In this embodiment, the cooling device 160 is positioned to provide cooling at the hot spot 165 of the LED die 155. This embodiment has the benefit that cooling is provided at the location where it is most needed. Positioning the cooling device directly against the LED die tends to maximize efficiency because the cooling is concentrated substantially on the LED die where thermal energy is generated and not on the surrounding elements.

Figure 3:
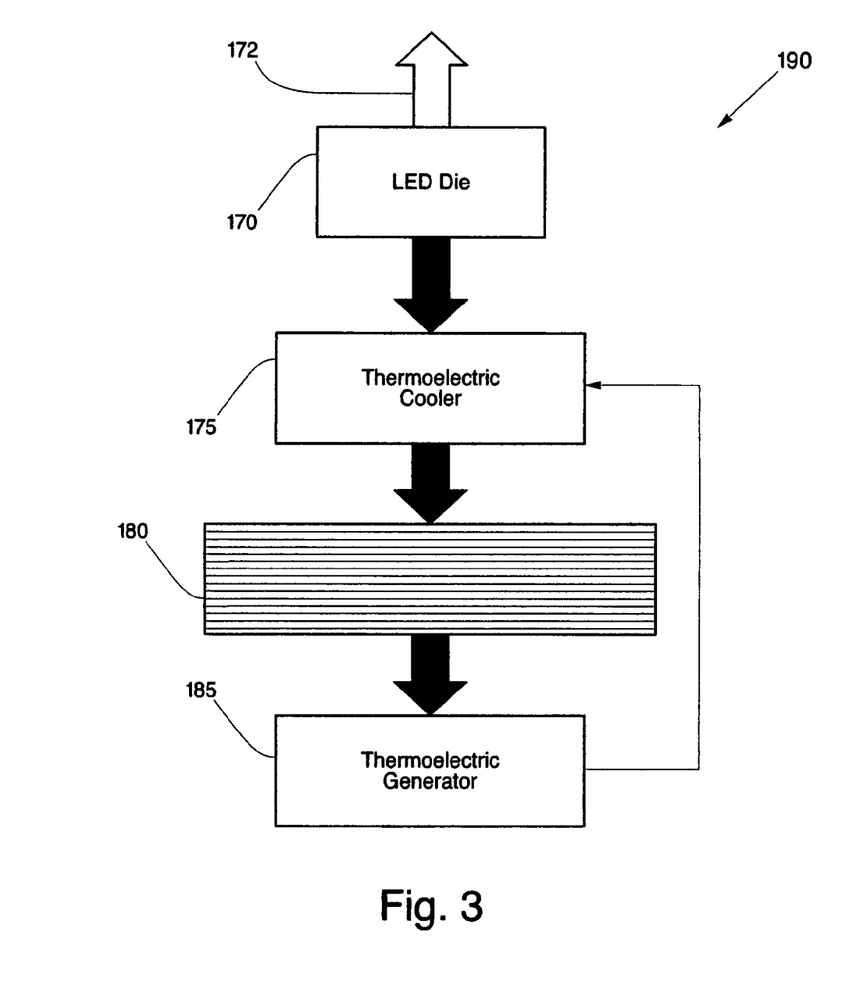
FIG. 3 illustrates an alternative embodiment of a unit of a high-power LED lamp according to principles of the invention.

FIG. 3 shows a further alternative embodiment of a high-power LED unit in diagram format. The LED unit 190 includes an LED die 170 emitting light 172, a thermoelectric cooler 175, a heat sink 180 and a thermoelectric generator 185. The thermoelectric generator 185 is for example the dTEG UPF40 Power Generator available from Nextreme Thermal Solutions, Inc. of Durham, N.C. In the LED unit 190, the LED die 170 is thermally coupled to the thermoelectric cooler 175. The thermoelectric cooler 175 is further thermally coupled to the heat sink 180. The heat sink 180 is further thermally coupled to the thermoelectric generator 185. The thermoelectric generator 185 is electrically coupled to the thermoelectric cooler 175.

In operation, the LED die 170 emits light and generates heat. The thermoelectric cooler 175 takes DC current as input and transfers heat from the LED die coupling to the heat sink coupling thereby removing heat from the LED die 170. The heat sink 180 dissipates heat passively. At least some of the heat from the heat sink 180 is transferred to the thermoelectric generator 185. The thermoelectric generator 185 generates a DC current. The DC current is received by the thermoelectric cooler 175 and is a portion of the energy needed for the operation of the thermoelectric cooler 175. The thermoelectric cooler 185 thus provides additional cooling that enables the heat sink to be reduced in size over the heat sink needed in a configuration without the thermoelectric cooler.

Figure 4:
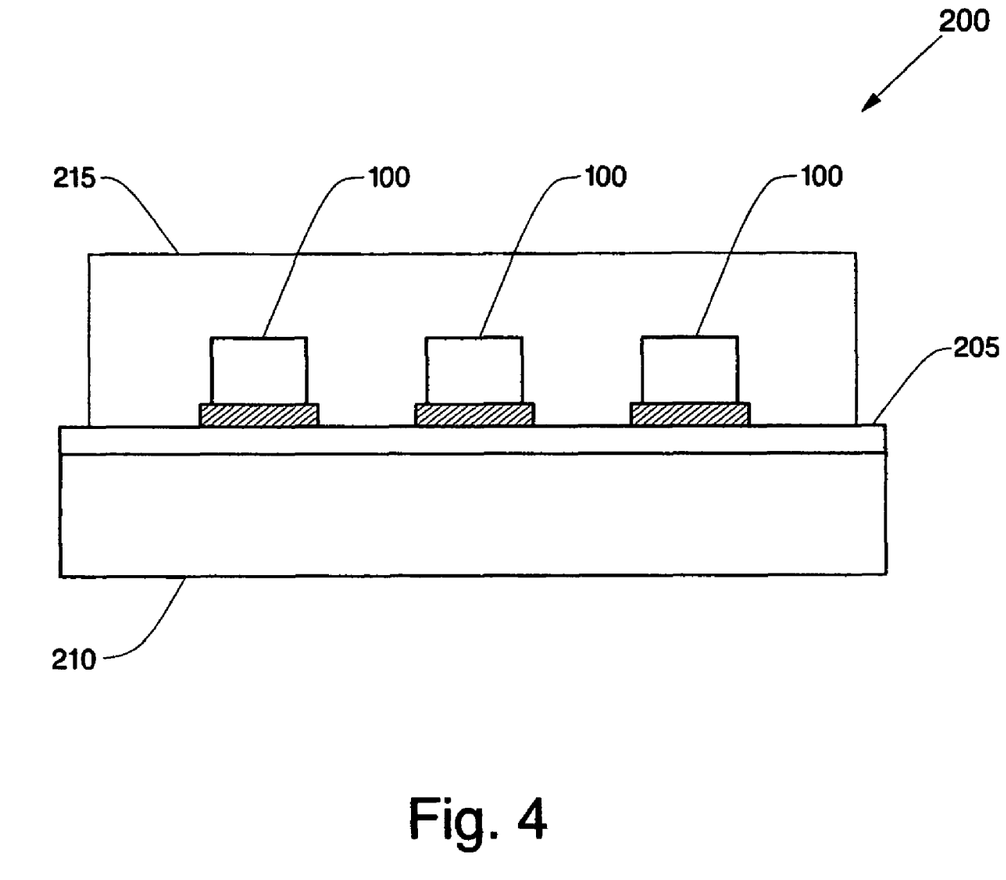
FIG. 4 is a side view of a module for a high-power LED lamp according to principles of the invention.

FIG. 4 is a block diagram of a module 200 for a high-power LED lamp according to one embodiment of the invention. The module 200, shown in side view, has a substrate 205 supporting a number of LED units 100. The substrate 205 provides electrical interconnection from the LED units 100 to the LED driver 115 (not shown) and power supply (not shown). In one embodiment, the module 200 is configured to fit into a support array of such modules to form a solid state lamp. This will be described in further detail below. In another embodiment of the invention, the module 200 is configured to couple both physically and electrically with other additional modules to form a solid state lamp. A covering 215 encloses the LED units 100. In a first embodiment, the covering 215 is merely protective of the LED die. In a second embodiment, the covering 215 includes an optical lens that directs the emitted light. In a third embodiment, the covering 215 is a diffuser to diffuse the emitted light. In a still further embodiment, the substrate 205 is coupled to a conductive plate 210 such as a metal heat sink. The heat sink provides additional cooling for the solid state lamp.

Figure 5:
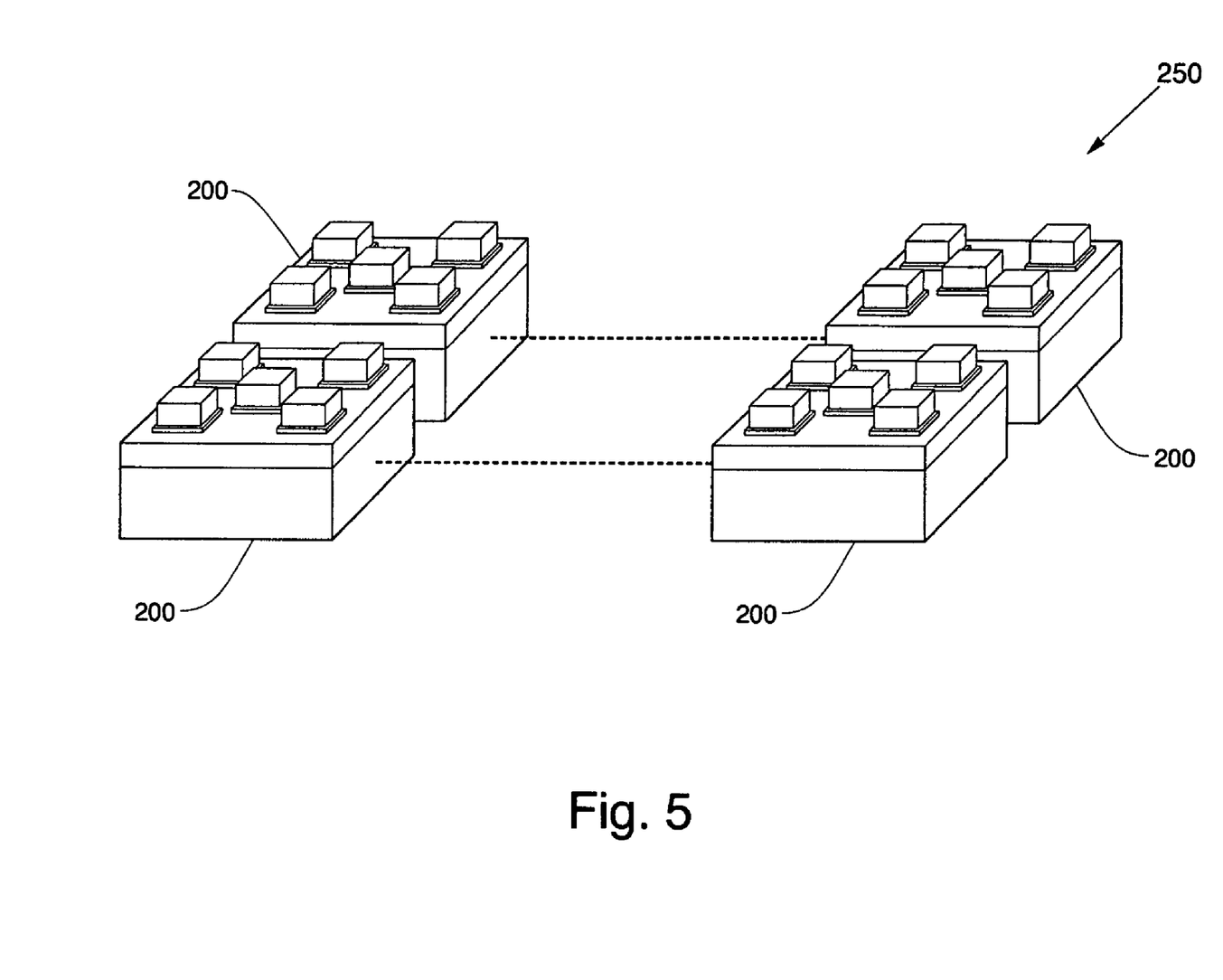
FIG. 5 is a diagram of collection of modules according to principles of the invention.

FIG. 5 is a diagram of collection 250 of modules 200 according to one embodiment of the invention. As described above, in one embodiment, the modules 200 are configured and adapted to a support array forming a solid state lamp. The modules 200 are interchangeable and replaceable enabling efficient lamp maintenance. A failed module can easily be replaced. In a second embodiment, the modules 200 are configured to connect together to form the solid state lamp.

Figure 6:
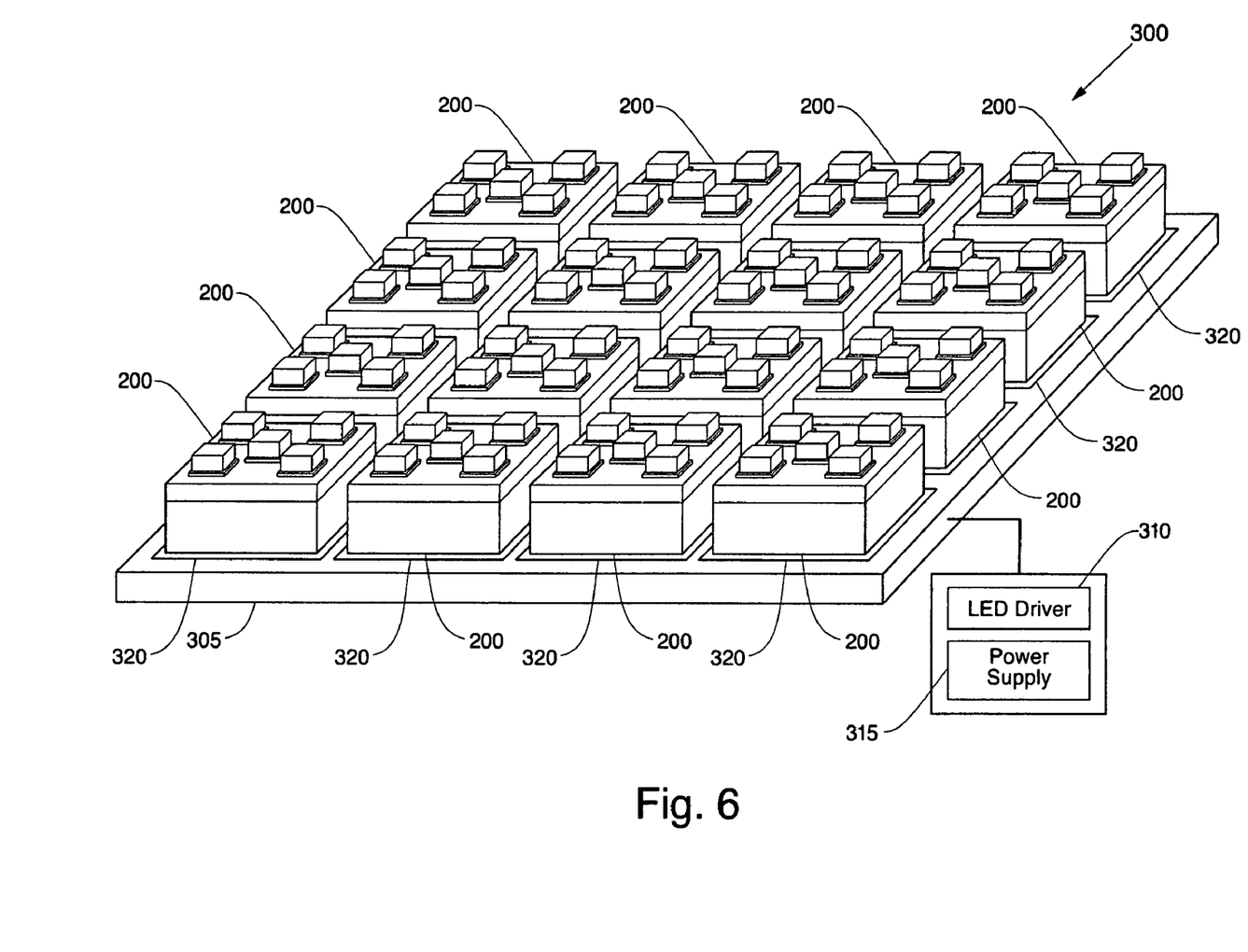
FIG. 6 is a diagram of an array of modules in a high-power LED lamp according to one embodiment of the invention.

FIG. 6 is a diagram of a high-power LED lamp 300 according to one embodiment of the invention. The lamp includes an array of modules 200. As described above, each module includes a plurality of units. The array of modules 200 is supported by a substrate 305. The substrate 305 includes a plurality of locations 320, each location 320 providing physical and electrical interconnect for a module 200. This substrate arrangement allows modules 200 to be easily removed and replaced. This greatly reduces maintenance expense as only individual modules may be replaced when needed rather than an entire lamp. An LED driver 310 drives the LEDs through connections in the substrate 305. A power supply 315 supplies power for the lamp and, in particular, supplies a constant current to the thermo-electric cooling devices, also through connections in the substrate 305, in the units.

Figure 7:
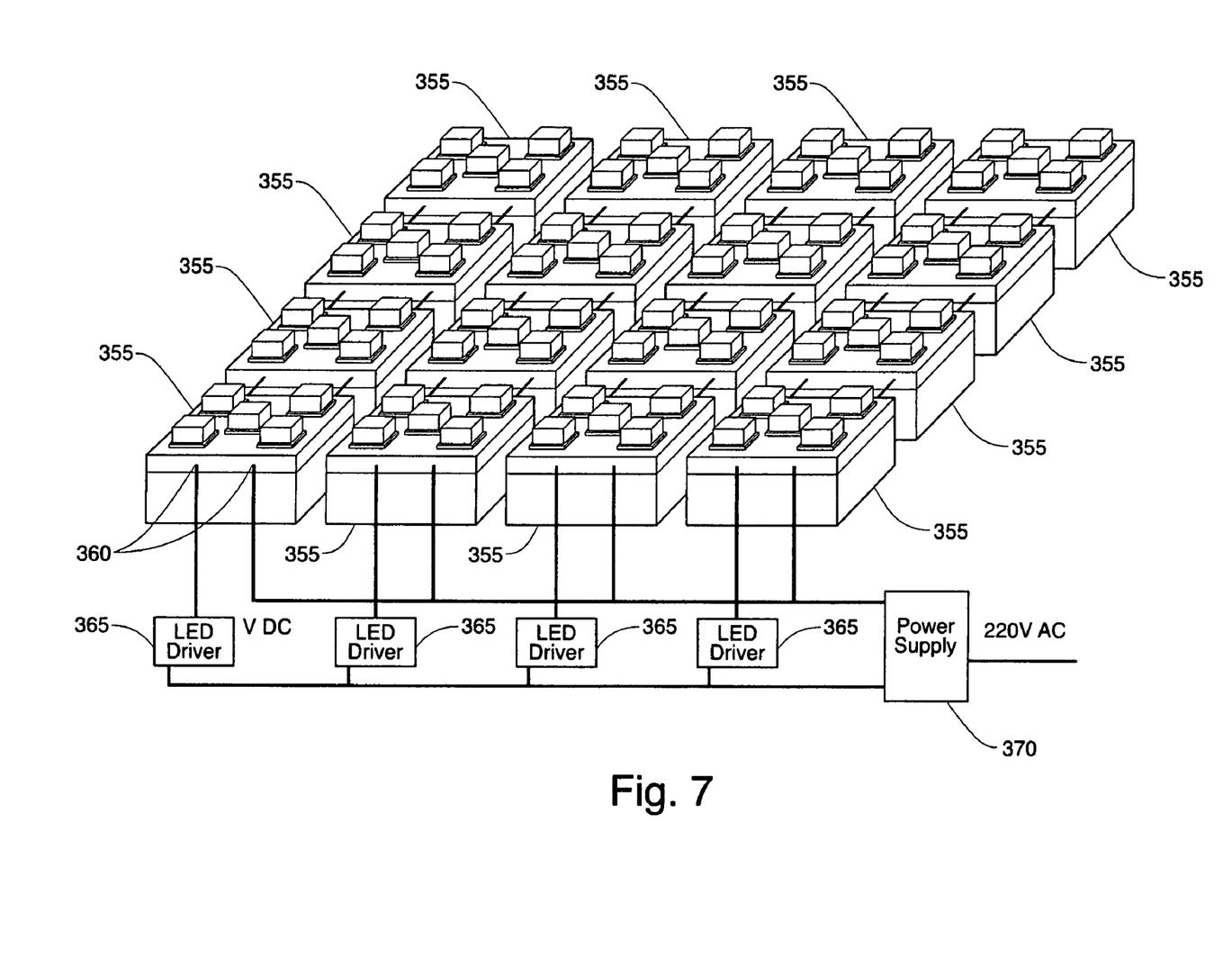
FIG. 7 is a diagram of an alternative arrangement of an array of modules in a high-power LED lamp according to principles of the invention.

FIG. 7 is a diagram of an alternative embodiment of a high-power LED lamp 350. The lamp 350 includes an array of modules. The modules 355 in this arrangement include physical and electrical connections 360 enabling each module 355 to mate with any other module 355. This arrangement enables the modules 355 to be replaceable within the array. In this arrangement, a plurality of LED drivers 365 each drive one row of modules 355 in the array. A power supply 370 supplies power for the lamp and also supplies a constant current to the thermo-electric cooling devices (not shown) in each unit in the modules 355.

Figure 8:
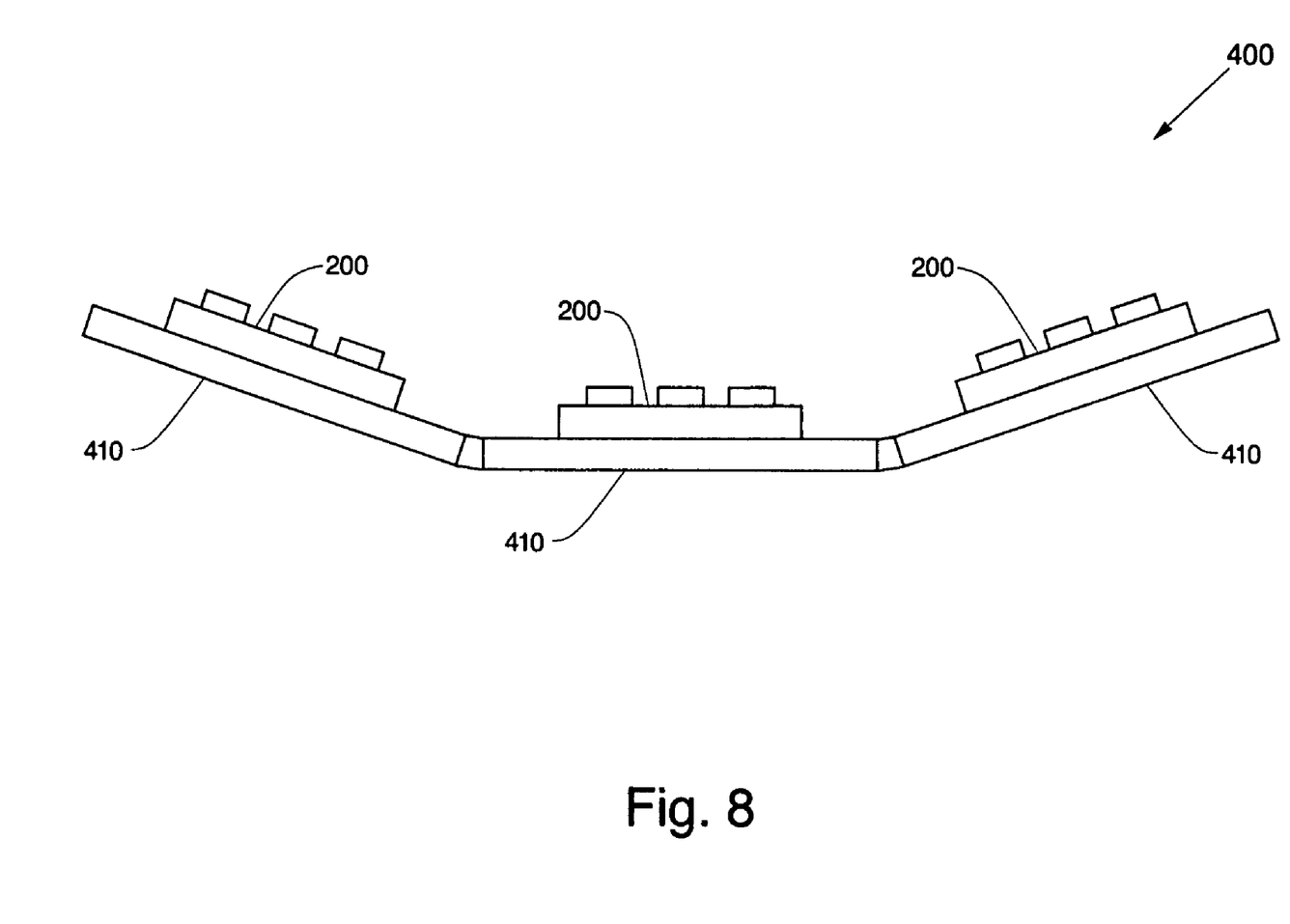
FIG. 8 is a diagram of another alternative arrangement of an array of modules in a high-power LED lamp according to principles of the invention.

FIG. 8 is a side view of a further alternative embodiment of a high-power LED lamp according to principles of the invention. The LED lamp 400 includes a plurality of modules 200. The plurality of modules 200 is mounted to substrates 410. The substrates 410 support the modules 200 in a non-planar arrangement. Only three modules 200 are provided in the illustration for the sake of clarity. The arrangement of substrates 410 and modules 200 shown is just one of many possible arrangements and is provided to illustrate that the modules may be configured as may be appropriate for a specific application such as area lighting, theatre lighting, parking structure lighting or street lighting. This list is merely exemplary. The present invention is not limited to the examples provided.

In a first arrangement, the modules 200 are physically and electrically coupled into the lamp 400 through the substrates 410, the substrates 410 providing conductive connections. In an alternative arrangement, the modules 200 are physically coupled to the substrates 410 but electrically coupled though connections between the modules 200. In one embodiment, the modules 200 have covers as described above with regard to FIG. 3. In a second embodiment, the lamp 400 includes a cover protecting all the modules. In a third embodiment, the lamp 400 includes focusing elements. Further alternative embodiments include diffusion elements.

Figure 9:
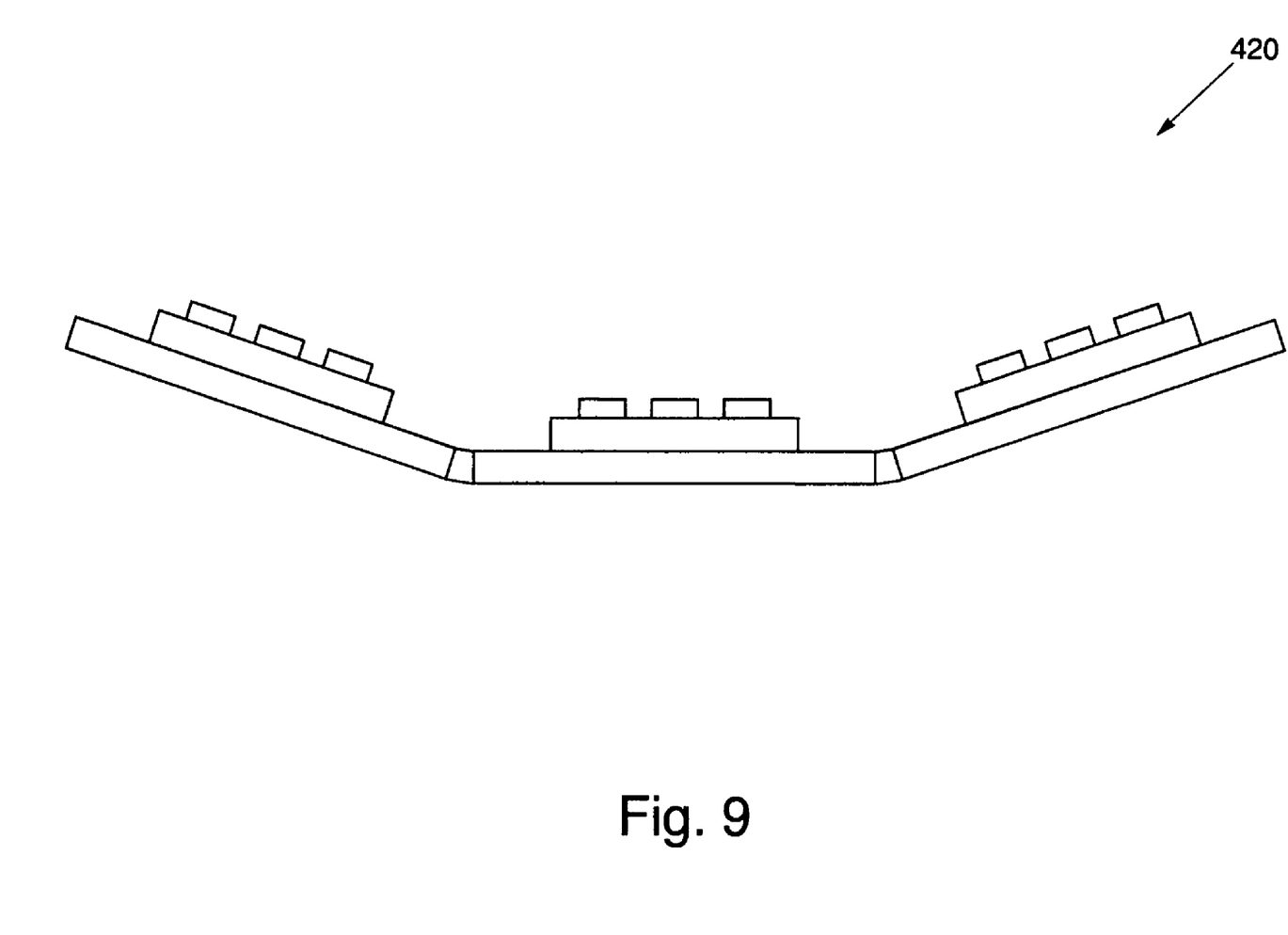
FIG. 9 is a diagram of a still further alternative arrangement of an array of modules in a high-power LED lamp according to principles of the invention.

FIG. 9 shows an alternative arrangement of modules 420 of a high-power LED lamp to that shown in FIG. 8.

Figure 10:
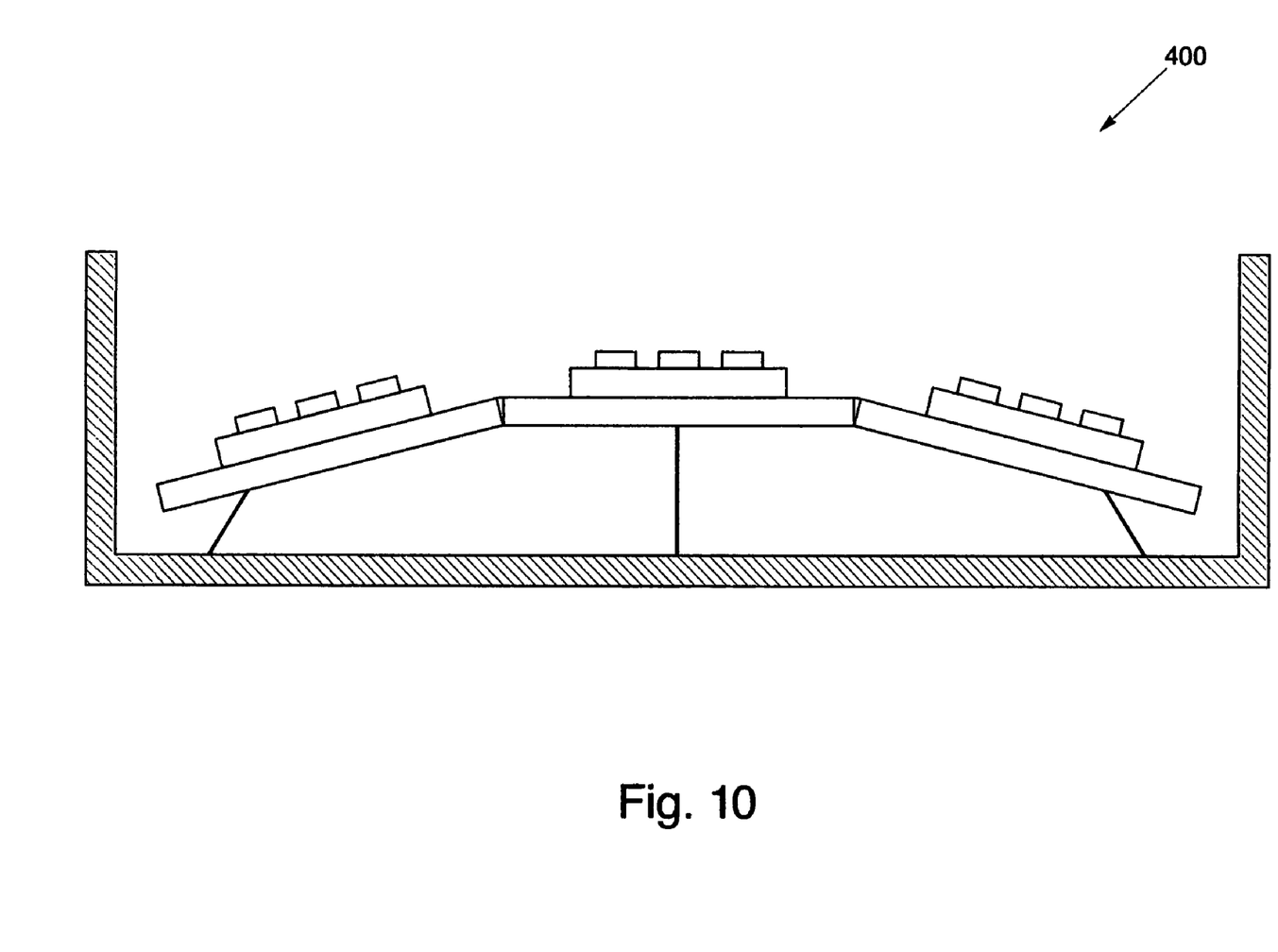
FIG. 10 is a diagram of an alternative embodiment of the high-power LED lamp according to principles of the invention.

FIG. 10 is a further alternative embodiment of a high-power LED lamp 500. In this embodiment, the modules 505 are enclosed in a heat conductive housing. Each module is thermally coupled to the housing. In a first arrangement, the thermal coupling of a module to the housing is accomplished through a copper ribbon. The housing in this embodiment performs as an additional heat sink in addition to those coupled to the LEDs on the modules. The heat sinks on the LEDs in this embodiment may therefore be smaller than in other embodiments resulting in an LED lamp that correspondingly weighs less.

Figure 11:
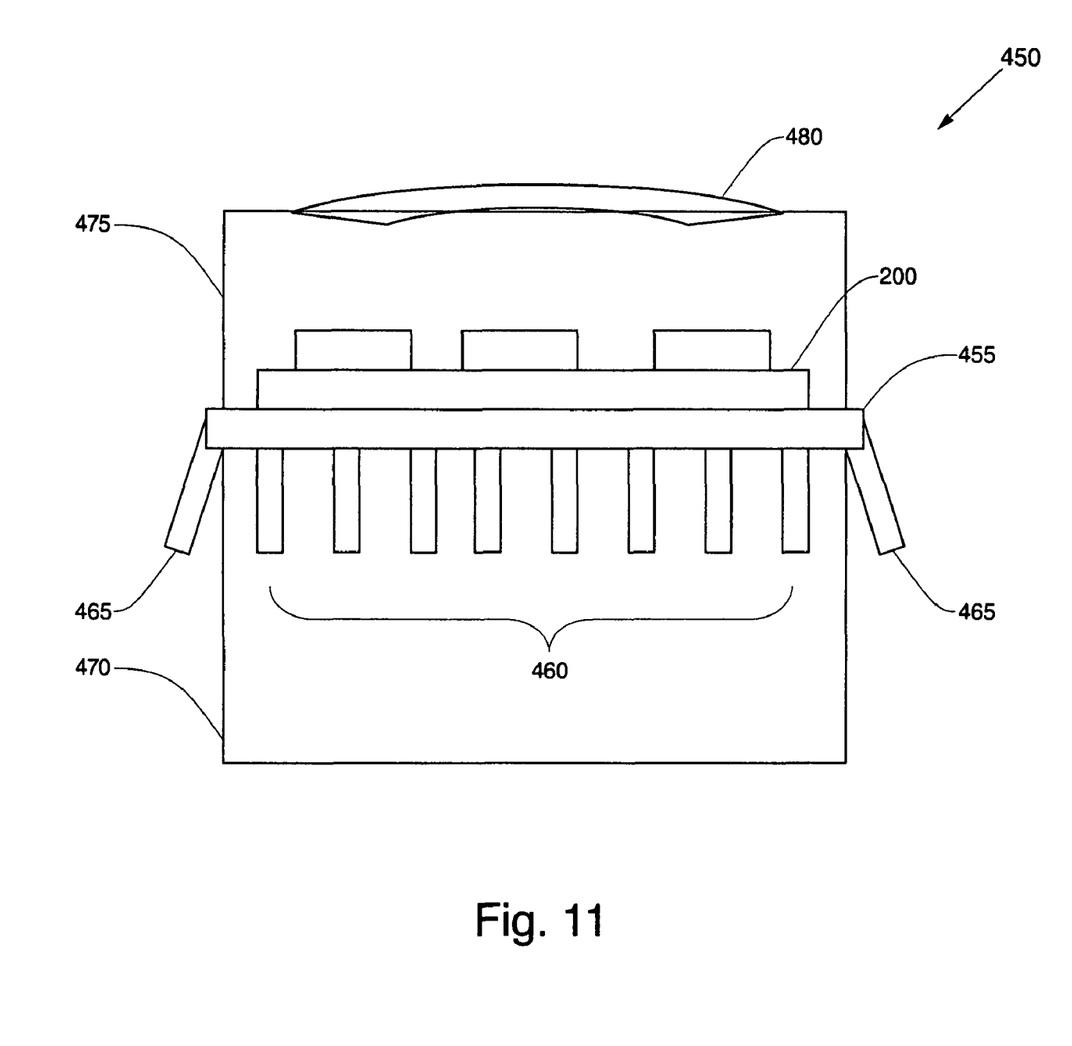
FIG. 11 is a diagram of a high-power LED lamp according to an alternative embodiment of the invention

FIG. 11 is a diagram of a high-power LED lamp 450 according to principles of the invention where the high-power LED lamp is suitable for use, for example, as a spot light or a stage light. An LED module 200 as described above is coupled to a heat sink 455 having a plurality of fins 460, 465. A lower hosing 470 supports the heat sink 455 and the LED module 200 and contains some of the heat sink fins 460. An upper housing 475 encloses the LED module 200 and supports an optical lens 480 configured to diffuse light from the LED module 200. The heat sink and fins 465 extend outside of the housings 470, 475 for cooling purposes. In the present embodiment, only one module 200 is shown for convenience. In a typical application, a plurality of modules would be included in the lamp.

It is to be understood that the above-identified embodiments are simply illustrative of the principles of the invention. Various and other modifications and changes may be made by those skilled in the art which will embody the principles of the invention and fall within the spirit and scope thereof.

I claim:

1. A unit for a high-power LED lamp, comprising:
   an LED die;
   a thermo-electric cooling device coupled to the LED die; and
   a power source supplying a predetermined fixed current to the thermo-electric cooling device, wherein the predetermined fixed current is based on heat generated by the LED die in normal operation enabling the thermo-electric cooling device to operate without a controller;
   wherein the predetermined fixed current is based on junction temperature of the LED die.

2. The unit of claim 1, wherein the thermo-electric cooling device is positioned at a hot-spot of the LED die.

3. The unit of claim 1, wherein the fixed current is set according to a predetermined value based on the heat generated by the LED die.

4. The unit of claim 1, wherein the fixed current is set to optimize energy consumption of LED lamp by enabling maximum light output from the LED lamp.

5. The unit of claim 1, wherein the thermo-electric cooling device is a thin film device.

6. The unit of claim 1, wherein the thermo-electric cooling device is a micro thermo-electric cooling device.

7. The unit of claim 1 further comprising:
   a heat sink coupled to the thermo-electric cooling device; and
      a thermo-electric generator coupled to the heat sink, the thermo-electric generator generating a current from heat from the heat sink, the current being provided to the thermo-electric cooling device.

8. A unit for a high-power LED lamp, comprising:
   an LED die;
   a thermo-electric cooling device coupled to the LED die; and
   a means for supplying a predetermined fixed current to the thermo-electric cooling device, wherein the predetermined fixed current is based on heat generated by the LED die in normal operation enabling the thermo-electric cooling device to operate without a controller;
   wherein the predetermined fixed current is based on junction temperature of the LED die.

9. A module for a high-power LED lamp, comprising:
   a conductive substrate;
   a plurality of LED units mounted on the conductive substrate wherein each LED unit of the plurality includes an LED die and a thermo-electric cooling device thermally coupled to the LED die; and
   means for supplying each thermo-electric cooling device with a predetermined fixed current, wherein the predetermined fixed current is based on a typical usage factor of the module, the means enabling the thermo-electric cooling device to operate without a controller;
   wherein the predetermined fixed current is based on junction temperature of the LED die.

10. The module of claim 9, wherein the substrate includes a conductive layer.

11. The module of claim 9, wherein the fixed current is based on a predetermined level of cooling.

12. The module of claim 11, wherein the level of cooling is determined by optimizing light output, energy use and lamp life.

13. The module of claim 9, wherein the thermo-electric cooling device is a nanotechnology cooling device.

14. The module of claim 9, wherein the thermo-electric cooling device is located at a hot spot on the LED die.

15. The module of claim 9, wherein the module is configured to mate with at least one other module to form a multi-module high power LED lamp.

16. The module of claim 9, wherein the module is configured to be located in and to operate in an array of modules forming a multi-module high power LED lamp, each module further configured to be replaceable.

17. A high power LED lamp, comprising:
   a plurality of LED modules configured to operate together to provide light, each module configured to be removable and replaceable, each module including:
   a conductive substrate;
   a plurality of LED units mounted on the conductive substrate wherein each LED unit of the plurality includes an LED die and a thermo-electric cooling device thermally coupled to the LED die; and
   means for supplying each thermo-electric cooling device with a predetermined fixed current, wherein the fixed current is based on a typical usage factor of the high power LED lamp, the means enabling the thermo-electric cooling device to operate without a controller;
   wherein the predetermined fixed current is based on junction temperature of the LED die.

18. The high power LED lamp of claim 17, wherein the means for supplying each thermo-electric cooling unit with a fixed current includes a single power supply providing power to the plurality of LED modules.

19. The high-power LED lamp of claim 17, wherein the plurality of modules is configured and arranged in a non-planar arrangement.

20. The high-power LED lamp of claim 17, wherein the plurality of modules is configured and arranged to provide illumination according to a specific lighting purpose.

21. The high power LED lamp of claim 17, wherein the plurality of modules is configured and arranged to provide illumination as a light pattern specific to a particular application.

* * * * *